United States Patent [19]
Amelio

[11] 3,995,302
[45] Nov. 30, 1976

[54] TRANSFER GATE-LESS PHOTOSENSOR CONFIGURATION

[75] Inventor: Gilbert F. Amelio, Saratoga, Calif.

[73] Assignee: Fairchild Camera and Instrument Corporation, Mountain View, Calif.

[22] Filed: Feb. 7, 1975

[21] Appl. No.: 547,844

Related U.S. Application Data

[63] Continuation of Ser. No. 357,760, May 7, 1973, abandoned.

[52] U.S. Cl. .............................. 357/24; 307/221 D; 357/30; 178/7.1
[51] Int. Cl.² ........................................ H01L 27/14
[58] Field of Search............. 357/24, 30; 250/211 J, 250/578; 307/304, 221 D; 178/7.1

[56] References Cited
UNITED STATES PATENTS

| | | | |
|---|---|---|---|
| 3,771,149 | 11/1973 | Collins et al. | 357/24 |
| 3,865,652 | 2/1975 | Agusta et al. | 357/24 |
| 3,898,685 | 8/1975 | Engeler et al. | 357/24 |

OTHER PUBLICATIONS

Anantha, IBM Tech. Discl. Bull, vol. 14, No. 4, Sept. 1971, p. 1234.

Tompsett et al. IEEE Trans. on Electron Devices, Nov. 1971, pp. 992–996.

Primary Examiner—William D. Larkins
Attorney, Agent, or Firm—Alan H. MacPherson; Henry K. Woodward; J. Ronald Richbourg

[57] ABSTRACT

The charge generated in semiconductor material by incident radiation is transferred to an adjacent region of the semiconductor material by lowering the potential on the adjacent region of semiconductor material relative to the potential in the region where the charge was initially generated. Charge is prevented from flowing back to the region where it was generated by means of a potential barrier formed between the generation region and the adjacent region by a region of semiconductor material highly doped relative to the substrate between said adjacent region and the region in which the charge is generated.

3 Claims, 7 Drawing Figures

TRANSFER GATE-LESS PHOTOSENSOR CONFIGURATION

This is a continuation of application Ser. No. 357,760 filed May 7, 1973 now abandoned.

BACKGROUND OF THE INVENTION

1. Field of the Invention

This invention relates to charge coupled devices and in particular to a method of tranferring charge from an element of a charge coupled device to an adjacent structure without the use of a transfer gate of a type heretofore used.

2. Description of the Prior Art

W. S. Boyle and G. E. Smith describe the basic concept of charge coupled semiconductor devices (hereinafter referred to as "CCD") in an article published in the April 1970 Bell System Technical Journal, page 587, entitled "Charge Coupled Semiconductor Devices". As discussed by Boyle and Smith, charge coupled devices are potentially useful as shift-registers, delay-lines, and in two dimensions, as imaging or display devices.

In U.S. Pat. application Ser. No. 343,759, filed on Mar. 22, 1973 by Choong-Ki Kim and Rudolph H. Dyck entitled "A Buried Channel, Charge Coupled Linear Array," now abandoned, a linear imaging array is described wherein one embodiment charge is detected in a line of light sensing elements and then transferred to two transport arrays adjacent to the imaging array by controlling the potential on transfer gates between the light sensing elements and the transport arrays. To reach the transport arrays, the charge is transferred in a direction approximately perpendicular to the linear array of light sensing elements before being read out for further processing. In the structure disclosed by Kim and Dyck, the transfer gate consumes surface area in the device and results in a layout topology which sometimes is cumbersome.

SUMMARY OF THE INVENTION

According to this invention, a structure is fabricated wherein the charge generated in each light sensing element of the CCD structure is transferred to an adjacent transport array without the use of the conventional-type transfer gate. This is achieved without sacrificing any of the charge control flexibility inherent in the devices of the prior art.

The transfer gate-less structure of this invention is obtained by forming a region in the semiconductor material between the light sensing element and the transport array containing impurity ions in a higher concentration than, but of the same conductivity type as, the predominant impurity ions in the underlying semiconductor material. Alternatively, the transfer gate-less structure is obtained by forming a region of opposite conductivity type in the semiconductor material as part of the transport array.

The invented structure reduces the complexity of linear and area imaging devices by eliminating the conductive material comprising the transfer gate. This simplifies the way in which potentials must be varied within the device to transfer charge from an imaging array to a transport array.

DETAILED DESCRIPTION

Figure 1A:
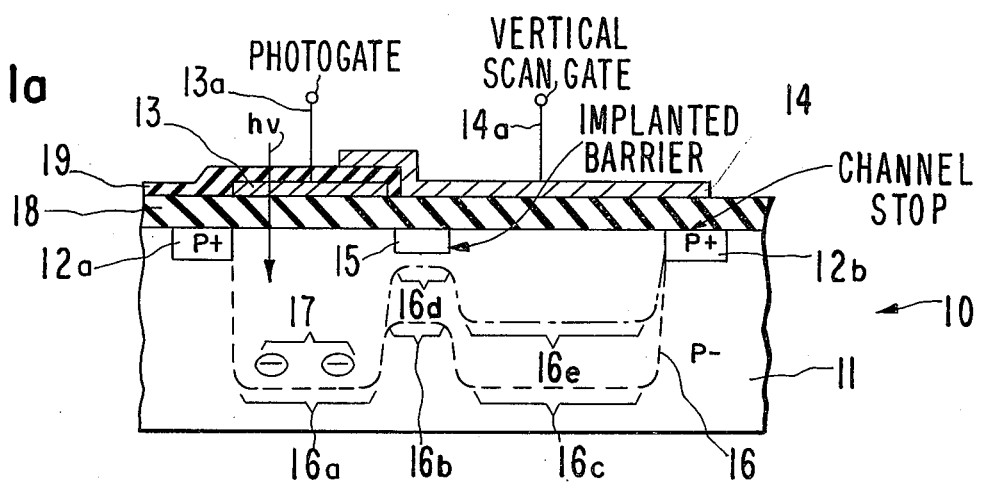
FIGS. 1a and 1b show in cross-section the structure of this invention with the potential distributions shown in dashed lines as they exist in the structure during charge generation in the light sensing element and during the transfer of charge from the light sensing element to the proper region of an adjacent transport array.
Figure 1B:
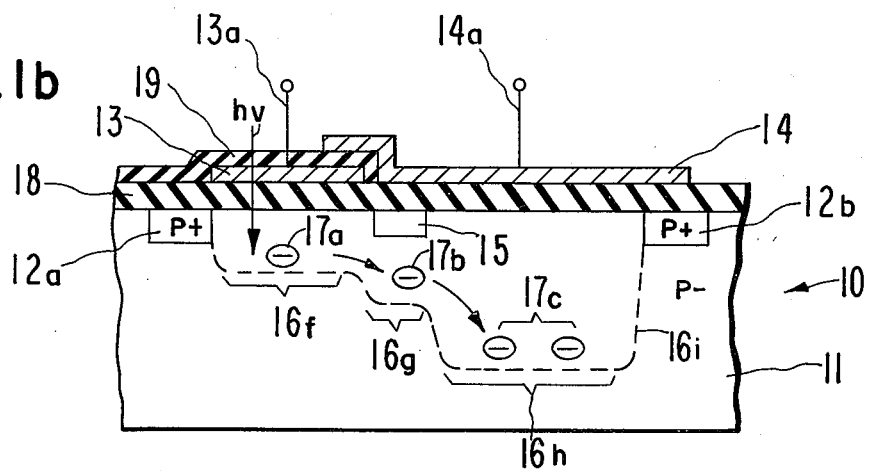

The structure of this invention is illustrated in cross-sectional view in FIGS. 1a and 1b. While this embodiment will be described as using silicon semiconductor material, it should be understood that this invention can be implemented with any semiconductor material in which a charge coupled device can be formed. Furthermore, while this invention will be described first in conjunction with a linear imaging array it should be understood that this invention can also be used with other types of imaging arrays such as area imaging arrays.

As described in the above-cited Kim and Dyck application, to avoid degrading the quality of the detected image, the charge representing a portion of the detected image is transferred from the light sensing element to an adjacent region of a transport array covered with an opaque material. The detected charge can then be removed from the transport array without being degraded by the light impinging on the transport array during read-out. To transfer the accumulated photocharge from the light sensing element to the adjacent region of the transport array, the prior art used an MOS type gate between the light sensing elements and the transport array. However, as shown in the structure of FIG. 1a, this transfer gate is eliminated by the use of region 15 containing impurity ions of a higher concentration than, but of the same conductivity type as, the predominant impurity ions in the semiconductor material 11.

The structure of FIG. 1a comprises a substrate 11 of semiconductor material (typically silicon) in which is formed a channel stop region 12 of which cross-sections 12a and 12b are shown. Substrate 11 is shown of P type conductivity and thus channel stop region 12 is likewise of P type conductivity, but with a higher concentration of P type impurities than in substrate 11.

Insulation 18 in one embodiment comprises a layer of silicon oxide. However, it should be understood that insulation 18 can if desired comprise any other suitable material or materials. Hereinafter, for convenience, substrate 11 together with regions formed therein and materials formed on one or more surfaces thereof will be called wafer 10.

Overlying the left hand portion of substrate 11 and insulation 18 is a photogate 13. Photogate 13 typically consists of a transparent material such as selectively-doped polycrystalline silicon but can also consist of a conductive, transparent metal. A potential is applied to electrode 13 through lead 13a to form a depletion region in the underlying semiconductor material. Thus photogate 13 together with insulation 18 and the underlying semiconductor material functions as an MIS capacitor. Incident light then passes through electrode 13 to this depletion region where it generates hole-electron pairs. The electrons gather in the depletion region in an amount proportional to the integral of the light incident on the particular region underlying electrode 13. Electrons 17 thus represent the intensity of the incident light.

Additional insulation 19 (typically, though not necessarily, an oxide of silicon such as silicon dioxide) is formed over electrode 13. A second electrode 14 is then formed over insulation 18 and 19 such that electrode 14 extends over part of, but is insulated from, electrode 13, as shown in FIGS. 1a and 1b. Electrode 14 is part of the transport array to which the charge 17 (shown as electrons) generated beneath electrode 13 will be transferred before being read-out from the device for further processing. The voltage used to control this read-out operation is applied to electrode 14 through lead 14a.

Region 15, which in FIG. 1a is of P type conductivity, typically is formed by use of ion implantation techniques. These techniques allow the precise control of the impurity concentration and the depth of this region. In one embodiment substrate 11, of P type conductivity, had an impurity concentration of about $2 \times 10^{14}$ atoms/cc and region 15, of P type conductivity, had an impurity concentration of $1 \times 10^{16}$ atoms/cc. In this embodiment, region 15 was about 0.5 microns deep and 5 microns wide. Other dimensions can, of course, be used for region 15, if desired.

In the structure of FIG. 1a, the electrodes 13 and 14 are clocked separately. There are four possible conditions for these electrodes; both are high (i.e., both have a high potential applied to them), both are low, or one electrode is at a high potential and the other electrode is at a low potential. Note that charge (electrons in the structure of FIGS. 1a and 1b) transfers from the region under electrode 13 to the region under the electrode 14 only if electrode 13 is at a high potential (i.e., low voltage, where the term "voltage" is used in its conventional sense) and electrode 14 is at a low potential. The electron potential in substrate 11 represented by this condition is shown by the dashed line 16i (hereinafter called "potential line 16i") in FIG. 1b. Note that the electron potential increases when the voltage applied to an electrode decreases. Thus, in FIG. 1b, for electrons 17 to transfer as shown from beneath electrode 13 to beneath electrode 14, the potential represented by line 16h in the region beneath electrode 14 must be relatively low corresponding to a high voltage on electrode 14. On the other hand, the high potential represented by line 16f in the region beneath electrode 13 corresponds to a low voltage on electrode 13. The potential represented by line 16g (FIG. 1b) in the region beneath ion-implanted region 15 is midway between the potential of the regions beneath electrodes 13 and 14. Thus electrons 17 transfer from beneath electrode 13 to beneath electrode 14 and are not impeded from completing this transfer by region 15.

As shown in FIG. 1a, electrode 14 extends over, but is insulated from, both region 15 and a portion of the right hand side of electrode 13. Because of this overlapping arrangement of electrodes 13 and 14, the potential barrier 16b (FIG. 1a) created by region 15 does not remain fixed in postion but rather rises with the rise in electron potential 16c in the region of semiconductor material 11 beneath electrode 14. Thus with a lowering of the voltage on electrode 14, the potential 16c in the region beneath electrode 14 rises to a position such as the one shown by the dashed line labeled 16e and simultaneously the potential represented by the dashed line 16b in the material beneath region 15 rises to a position such as the one shown by line 16d. Thus, the potential of the region beneath implanted barrier 15 always remains approximately a given amount above the potential of the material to the right of implanted region 15 and beneath electrode 14. The height of this potential barrier is controlled by the relative impurity concentrations of region 15 and substrate 11. Because electrode 13, however, does not extend over region 15, lowering of the voltage on electrode 13 results in the potential in the region beneath electrode 13 rising to a level such as the one shown by the dashed line section labeled 16f (FIG. 1b). The potential in the region beneath region 15 is not substantially affected by the change in voltage on electrode 13 and thus charge transfers from beneath electrode 13 to beneath electrode 14 but cannot transfer back.

It should be noted that the relative potentials functionally equivalent to those shown in FIGS. 1a and 1b can be achieved by use of donor ions placed under the right side of electrode 14 in region 20 (FIG. 1c) and the omission of region 15 with the acceptor ions. This structure, shown in FIG. 1c, uses a CCD buried channel 20a and differs from the structure shown in FIGS. 1a and 1b only in the absolute amplitude of the channel potential.

Figure 1C:
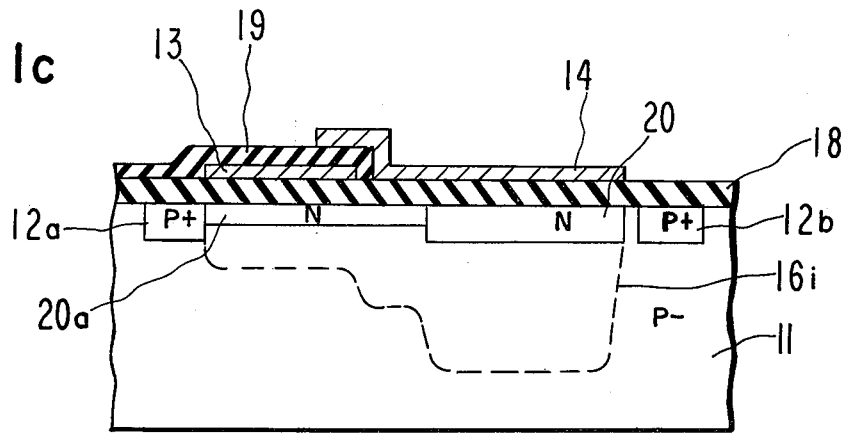
FIG. 1c shows in cross-section an alternative structure of this invention using an ion-implanted region of opposite conductivity type to that used in FIGS. 1a and 1b.

While FIG. 1c shows an N-type buried channel beneath photogate 13 extending to N-type ion-implanted region 20, buried channel 20a can, if desired, be omitted from this structure. The buried channel charge coupled device is described in more detail in an article entitled "The Buried Channel Charge Coupled Device by R. H. Walden, et al, which is published in the Bell System Technical Journal, Sept. 1972, at page 1635. The advantage of the N-type buried channel shown in FIG. 1c is that if the CCD transport array is to be formed with a buried channel in the CCD area, the buried channel in the light sensing element is achieved with no additional processing. The buried channel, however, is optional, depending upon the actual process employed in manufacturing the structure.

The configurations shown in FIG. 1a, 1b and 1c are easily adapted to the interlace requirements of area sensors as will not be described.

Figure 2A:
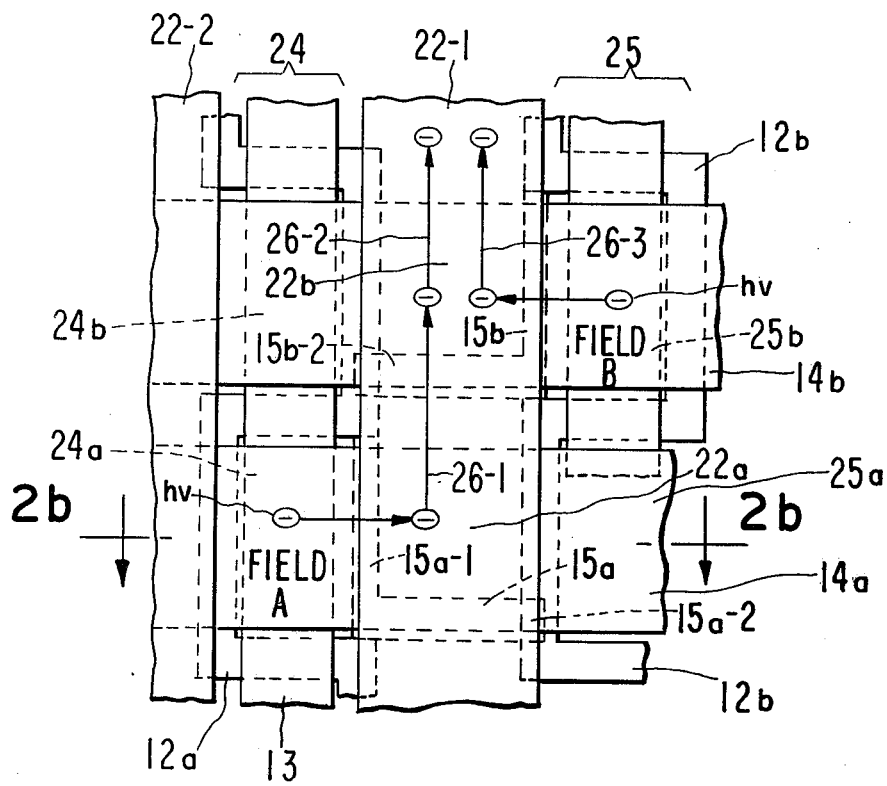
FIG. 2a shows the plan view of a portion of a device using the structure of this invention.
Figure 2B:
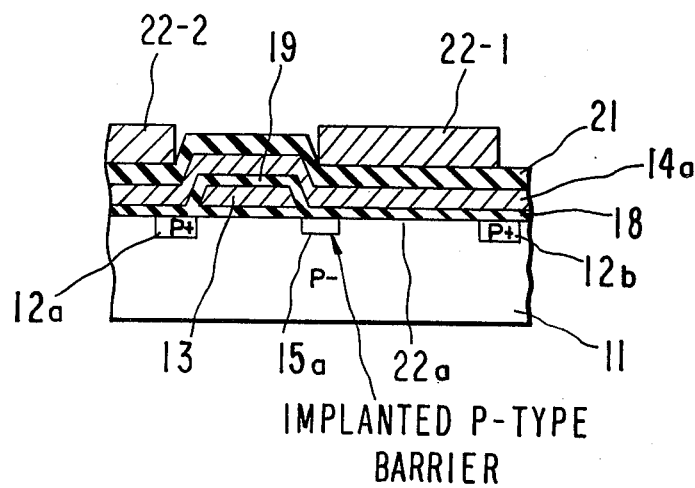
FIG. 2b shows the cross-section of a portion of the array of FIG. 2A.

FIG. 2a shows the plan view of a portion of an area sensing structure constructed in accordance with the principles of this invention and operating in an interlace made compatible with standard television practices. FIG. 2b is a cross-sectional view of a portion of the array of FIG. 2a taken along lines 2b (FIG. 2a). In FIG. 2a only four light sensing elements are shown; elements 24a and 24b in column 24 and elements 25a and 25b in column 25. It should be understood that while only two columns each with two light sensing elements are shown in detail in FIG. 2a, the structure of FIGS. 2a and 2b can contain as many columns of light sensing elements with as many elements in each column as required by the design and the limitations inherent in the manufacture of the array. For example, 100 × 100 area arrays with 10,000 light sensing elements can be constructed in accordance with the principles of this invention.

In operation, light incident on the top surface of the structure of FIGS. 2a and 2b generates charge in the light sensing elements of this structure. Thus light sensing element 24a accumulates charge in proportion to the amount of light incident on it. Light sensing elements 24b, 25a and 25b accumulate charge in a similar manner. The charge-packets accumulated in elements 24a and 24b are retained beneath electrode 13 by channel stop region 12a (which winds in a serpentine fashion along the row of light sensitive elements 24 such that channel stop region 12 appears on three sides of each light sensitive element 24a, 24b, etc.) and by ion-implanted regions such as arm 15a-1 of region 15a. Channel stop region 12a is described in more detail in the above-mentioned Kim and Dyck patent application.

Looking now in more detail at light sensing element 24a shown in cross-section in FIG. 2b, charge generated in semiconductor material 11 beneath electrode 13 is transferred to the right to the region beneath electrode 14a and portion 22a (FIG. 2a) of opaque aluminum shield 22-1. Arm 15a-1 of "L-shaped" ion-implanted region 15a extends between light sensing element 24a and region 22a. In addition, arm 15a-2 of region 15a extends perpendicularly to the length of aluminum shield 22-1 across and beneath shield 22-1. Arm 15a-2 of ion-implanted region 15a serves in conjunction with similar portion 15b-2 of ion-implanted region 15b in the next charge storage region beneath aluminum shield 22-1, to allow the charge stored beneath aluminum shield 22-1 to be read out of the array using a two-phase read-out system rather than the common three-phase system. Thus charge is read out along aluminum shield 22-1 in the direction of arrows 26-1, 26-2 and 26-3. Aluminum shield 22-1, being opaque, insures that light incident on the array does not affect the quantity of charge being transported out of the array beneath shield 22-1.

The cross-sectional view (FIG. 2b shows the extension of electrode 14a across a plurality of light sensitive areas beneath electrodes identical to and parallel to electrode 13. While only one such light sensitive area and electrode is shown in FIG. 2b, it should be understood that if this cross-sectional view were extended to the left and right, a plurality of such areas would be shown in cross-sectional view and these areas would be identical to the one shown. Thus the structure shown in FIGS. 2a and 2b comprises an area array capable of sensing light incident on an area of semiconductor material rather than a linear array capable of sensing light incident on a line.

Each column of light sensing elements shown in FIG. 2a, such as column 24 or column 25, has the packets of charge (hereinafter referred to in the singular as "charge packet") generated in adjacent light sensing elements read out in opposite directions. Thus the charge generated in element 24a in column 24 is read out to the right to region 22a beneath both shield 22-1 and electrode 14a. The charge generated in light sensing element 24b in column 24 is read out to the left, to a region of semiconductor material 11 beneath aluminum shield 22-2. The charge generated in light sensing element 25a in column 25 is read out to the right to a region of semiconductor material not shown in the Figures, while the charge generated in the light sensing element 25b in column 25 is read out to the left to the adjacent region of semiconductor material 11 beneath both aluminum shield 22-1 and polycrystalline silicon electrode 14b.

The CCD transport array comprising those portions of electrodes 14a, 14b, etc., insulation 18 (FIG. 2a) and semiconductor material 11 underlying opaque aluminum shield 22-1 is a two-phase transport array. This transport array operates in a manner similar to that in which a charge packet is transferred from a light sensing element to an adjacent region in the transport array as described above. Thus arms 15a-2 and 15b-2 of ion-implanted regions 15a and 15b serve the same function in the transport array that arms 15a-1 and 15b-1 serve in the transfer of charge from the light sensing element to the transport array. However, the charge in all the light sensing elements in a column of light sensing elements is not transferred to the transport array at one time. Rather, the charge packets generated in every other light sensing element are transferred at one time to a given transport array. For example, the charge packets generated in the "odd" light sensing elements 24a, 24c, 24e, etc. (elements 24c and 24e are not shown in FIG. 2a) are all transferred at one time to adjacent regions of the transparent array beneath the aluminum shield 22-1. However, the charge packets in the "even" light sensing elements 24b, 24d, 24f, etc. (elements 24d and 24f are not shown in FIG. 2a) are read out to the left to adjacent regions of the transport array covered by opaque aluminum shield 22-2. These charge packets are not, however, transferred to transport array 22-2 until the previously read-out charge packets from the light sensing elements 23a, 23c, etc. (not shown in FIG. 2a, but located just to the left of opaque shield 22-2) have been removed from the array. Thus two transport arrays are required to remove from the array the charge packets generated in one column of light sensing elements. However, the charge packets generated in a given column are removed in two steps; for example, first the charge packets generated in the even numbered sensing elements are transferred to a first transport array and then read out of the first transport array to a utilization structure. Then the charge packets in the odd numbered light sensing elements are transferred to a second array on the other side of the column of light sensing elements, read out of this second transport array, and transmitted to the utilization structure for use there. Thus a given transport array reads out charge packets generated in two columns of light sensing elements and conversely, each line of light sensing elements requires two transport arrays for removal of the charge from the array. One more transport array is required than there are columns of light sensing elements.

Naturally, the timing sequence during which different potentials or voltages are applied to the electrodes over the transport array is complicated. For example, to read out a charge packet from a light sensing element to the adjacent region of a transport array, the voltage on electrode 13 (FIG. 2b) is lowered and the voltage on every other tranport electrode (for example, electrodes 14a, 14c, 14e, etc.) is raised. Then, to read the transferred charge packets out along the transport array without at the same time drawing out additional charge packets from the light sensing elements adjacent to the transport array, the voltage on all electrodes such as electrode 13 is raised to a given level. The charge packets are driven along the transport array by periodically raising and lowering the voltages on adjacent electrodes 14a, 14b, 14c., while never raising the voltage on electrode 14 above the voltage on electrode 13 by more than the height of the potential barrier created by P type region 15a (FIG. 2b).

It should be noted from FIG. 2b that aluminum shield 22-1, for example, is insulated from the underlying electrode 14a (typically formed of doped polycrystalline silicon) by insulation 21. Insulation 21 can comprise an oxide of silicon, silicon nitride, a combination of these materials, or any other material or materials suitable for insulating shield 22-1 from electrode 14a while transmitting light through to the region in substrate 11 underlying electrode 13.

While FIGS. 2a and 2b show two sections of an area array using the principles of this invention, it should be understood that this area array comprises a plurality of linear imaging arrays. Thus, for example, column 24 of light sensing elements together with the transport arrays covered by opaque material 22-1 and 22-2 on either side of column 24, taken alone, comprises a linear array. While this linear array transfers charge from adjacent light sensing elements (for example, elements 24a and 24b) in opposite directions, this invention can also be used with a linear array of the type disclosed in the above-described patent application of Kim and Dyck wherein the charge from the light sensing elements in the linear array is transferred to a single transport array located on one side of the linear imaging array.

Figure 3:
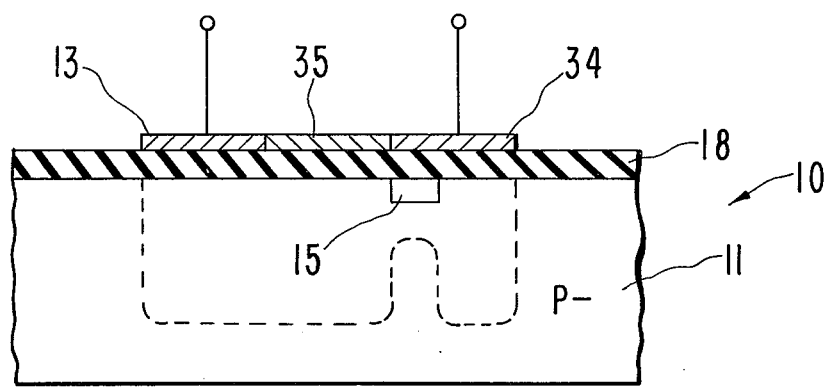
FIG. 3 shows in cross-section an alternative structure constructed in accordance with this invention.

FIG. 3 shows in cross-section an alternative structure embodying the principles of this invention. Wafer 10 comprises substrate of semiconductor material 11 shown in FIG. 3 as having a P type conductivity. Insulation 18 is formed on the top surface of substrate 11. Photogate 13 is formed over insulation 18 as in the above-described earlier embodiment. However, the embodiment of FIG. 3 contains, instead of electrode 14, electrode 34 and film 35 of resistive material extending between photogate 13 and conductive electrode 34. When photogate 13 and electrode 34 are formed from doped polycrystalline silicon, resistive film 35 is advantageously formed from undoped polycrystalline silicon in the manner disclosed in U.S. Pat. No. 3,728,590 issued Apr. 17, 1973, on an invention of Kim and Snow and assigned to the assignee of this application. Ion-implanted region 15 is then formed beneath the left portion of electrode 34. Ion-implanted region 15 contains impurities of the same conductivity type as, but to a higher dopant concentration than, substrate 11. Thus the potential distribution in semiconductor material 11 has the shape shown by the dashed line in FIG. 3 when the potentials on photogate 13 and electrode 34 are equal. Ion-implanted region 15 again acts as a barrier in the same manner as does the ion-implanted regions shown in FIGS. 1a and 1b. On the other hand, resistive film 35 insures that the potential in the semiconductor material 11 beneath resistive layer 35 is the same as or varies between the potentials on photogate 13 and electrode 34. The advantage of the structure shown in FIG. 3 is that only a single layer of conductive material is required to form the electrodes and the extension of electrode 14 over a portion of photogate 13 is eliminated. Thus the structure of FIG. 3 can be made using a simpler process than can the structures of FIGS. 1a, 1b and 1c.

Figure 4:
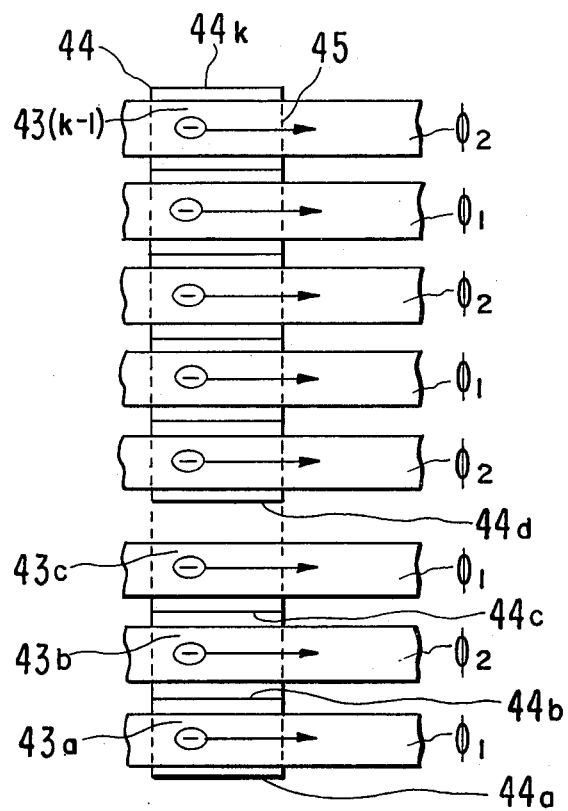
FIG. 4 shows an alternative channel stop structure useful in an array of light sensing elements constructed in accordance with this invention.

FIG. 4 shows an alternative embodiment of the serpantine channel stop region shown in FIG. 2a. In FIG. 4 channel stop region 44 is shaped like a comb with the "teeth" 44a, 44b, 44c, 44d through 44k (where k, the number of teeth pointing to the right, is one more than the number of light sensing elements 43a through 43 (k-1) contained in the device). Along the right hand side of the light sensing elements 43a through 43 (k-1) is formed an ion-implanted region 45 shown as a solid and, where it goes under the electrodes labled $\phi_1$ and $\phi_2$, a dashed line. Region 45 functions in the same manner as does region 15, for example, in FIGS. 1a and 1b. The charge packets generated in the odd light sensing elements 43a, 43c, etc. are first transferred to a transport array on the right by lowering the potential on the electrodes labled $\phi_1$. The transport array then operates as a two-phase CCD array to read out the charge packets in the transport array at a high frequency. Then the charge packets in the even light sensing elements 43a, 43d, etc. are transferred to the transport array on the right by lowering the potential on the electrodes labeled $\phi_2$. These charge packets are then read out from the transport array in the same manner as were the previously transferred charge packets. It should be noted that an opaque material such as aluminum overlies the transport array parallel to the line of light sensing elements 43a to 43 (k-1). For simplicity, this opaque material and other structural features of the transport array of FIG. 4 are not shown.

The advantage of the structure of FIG. 4 is that an area array constructed using the comb-like channel stop structure 44 shown there requires one less opaque shield and one less transport array then does the area array of the type shown in FIG. 2a. In addition, the timing of the transfer and read-out signals is simpler in the structure of FIG. 4 than in the structure of FIG. 2a because of the reduction in structural complexity.

The structure shown in FIG. 4 is part of a much larger area array containing a plurality of identically arranged lines of light sensing elements and transport arrays. However, a single line of light sensing elements together with a single adjacent transport array, constructed as shown in FIG. 4, and appropriate read-out circuitry, comprises a linear array of light sensing elements.

What is claimed is:

1. An area imaging array comprising the combination of N charge coupled linear arrays in semiconductor material containing a selected dopant, said arrays arranged in side-by-side relation with N + 1 shift registers, where N is a positive integer representing the number of linear imaging arrays in said area imaging array, such that a different linear imaging array is located between adjacent shift registers to form said area imaging array;
    said linear imaging arrays each comprising:
        a. a line of light sensing elements comprising a first plurality of electrodes formed on the top surface of insulation and formed over a corresponding plurality of regions in said semiconductor material;
        b. a first shift register located on one side of said line of light sensing elements, said first shift register comprising a second plurality of electrodes formed on the top surface of insulation formed over said semiconductor material, each of said second plurality of electrodes disposed adjacent to a corresponding one of said light sensing elements, and each of said second electrodes having a portion which extends over, but is insulated from, a portion of each of said first plurality of electrodes;

c. means for controlling the transfer of charge packets from said light sensing elements to said first shift register comprising first regions formed in said semiconductor material between said line of light sensing elements and said first shift register and directly adjacent to said corresponding light sensing element, said first regions containing a dopant of the same type as, but in a higher concentration than, the predominant dopant in said semiconductor material, thereby forming a potential barrier between said line of light sensing elements and said first shift register; and, d. means for varying the potential of each of said first plurality of electrodes and means for varying the potential on said second plurality of electrodes thereby to transfer selected charge packets in said line of light sensing elements to appropriate positions in said first shift register when the voltage on the corresponding electrode in said first plurality of electrodes is low with respect to the voltage on corresponding electrodes in said second plurality of electrodes.

2. Structure as in claim 1 wherein said second plurality of electrodes are interconnected to form a single electrode.

3. Structure as in claim 1 including a second region of semiconductor material more highly doped than, but of the same conductivity type as, said semiconductor material, formed in said semiconductor material directly beneath said insulation on three sides of each of said first plurality of regions in semiconductor material.

* * * * *